(12) United States Patent
Chen et al.

(10) Patent No.: US 11,049,536 B2
(45) Date of Patent: Jun. 29, 2021

(54) MEMORY DEVICE HAVING HARDWARE REGULATION TRAINING

(71) Applicant: Shanghai Zhaoxin Semiconductor Co., Ltd., Shanghai (CN)

(72) Inventors: Chen Chen, Beijing (CN); Qiang Si, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/595,847

(22) Filed: Oct. 8, 2019

(65) Prior Publication Data

US 2021/0027818 A1 Jan. 28, 2021

(30) Foreign Application Priority Data

Jul. 22, 2019 (CN) .......................... 201910660657.3

(51) Int. Cl.
| | |
|---|---|
| *G11C 7/22* | (2006.01) |
| *G11C 5/04* | (2006.01) |
| *G11C 11/4076* | (2006.01) |
| *G11C 11/4096* | (2006.01) |

(52) U.S. Cl.
CPC ................ *G11C 7/222* (2013.01); *G11C 5/04* (2013.01); *G11C 11/4076* (2013.01); *G11C 11/4096* (2013.01)

(58) Field of Classification Search
CPC ....... G11C 7/222; G11C 5/04; G11C 11/4076; G11C 11/4096

USPC .................................................... 365/189.16
See application file for complete search history.

(56) References Cited

U.S. PATENT DOCUMENTS

| | | | | |
|---|---|---|---|---|
| 4,759,018 | A * | 7/1988 | Buchner | ................. H04J 3/047 370/535 |
| 6,885,594 | B2 * | 4/2005 | Fukushima | .............. G11C 7/22 365/189.05 |
| 9,449,665 | B1 * | 9/2016 | Kim | ......................... G11C 7/10 |
| 2003/0161210 | A1 * | 8/2003 | Acharya | .............. G11C 7/1072 365/233.1 |
| 2004/0233814 | A1 * | 11/2004 | Nishimura | ............. H01S 5/042 369/59.11 |
| 2005/0134287 | A1 * | 6/2005 | Satou | ................. G01R 31/3191 324/537 |
| 2006/0158955 | A1 * | 7/2006 | Koga | ...................... G11C 7/22 365/189.08 |

(Continued)

*Primary Examiner* — Sung Il Cho
(74) *Attorney, Agent, or Firm* — McClure, Qualey & Rodack, LLP

(57) ABSTRACT

A memory device includes a memory control unit and a write output clock device. The memory control unit is used to provide a write input clock and a first control value. The write output clock device produces a plurality of internal clocks based on the write input clock, and selects a target internal clock from the plurality of internal clocks, and further delays the target internal clock to become a write output clock to a memory unit based on the first control value. The memory unit produces a data signal based on the write output clock. The memory control unit identifies whether the write output clock meets the time-sequence requirements of the memory unit. If the time-sequence requirements are not met, the memory control unit changes the first control value and/or changes the selected target internal clock to change the write output clock.

9 Claims, 5 Drawing Sheets

(56) References Cited

U.S. PATENT DOCUMENTS

| | | | | |
|---|---|---|---|---|
| 2008/0288806 A1* | 11/2008 | Kang | ........................ | G06F 1/04 |
| | | | | 713/500 |
| 2009/0161453 A1* | 6/2009 | Giovannini | ............... | G06F 5/06 |
| | | | | 365/193 |
| 2012/0113728 A1* | 5/2012 | Kwon | .................. | G11C 7/1087 |
| | | | | 365/189.05 |
| 2019/0198075 A1* | 6/2019 | Lee | ...................... | G11C 29/023 |

\* cited by examiner

MEMORY DEVICE HAVING HARDWARE REGULATION TRAINING

CROSS REFERENCE TO RELATED APPLICATIONS

This Application claims priority of China Patent Application No. 201910660657.3, filed on Jul. 22, 2019, the entirety of which is incorporated by reference herein.

BACKGROUND OF THE INVENTION

Field of the Invention

The present invention relates to a memory device and, in particular, to a memory device having hardware regulation training.

Description of the Related Art

With the widespread use of dual in-line memory modules (DIMMs) in personal computers and server systems, adjusting the data transmission of DIMMs has become an important issue. DIMM techniques have been developed to include Double-Data-Rate third generation (DDR3) DRAM and the newest Double-Data-Rate fourth generation (DDR4) DRAM. To support the operation of DDR3 and DDR4 in high-frequency environments, DIMM has adopted the topology of a Fly-by structure in order to reduce synchronous noises and improve signal integrity.

In the Fly-by structure, the clock signals, command signals, read/write data and addresses go through each DRAM (dynamic random access memory) particle, and the read/write data is connected to each DRAM particle. Because the clock signals, command signals, read/write data and addresses are delivered to each DRAM particle on the DIMM at different distances, there is a distinct transmission time between the read/write data reaching each DRAM particle on the DIMM. As a result, the present invention provides a memory device to make the clock period of the read/write data comply with the clock period on the DIMM when the read/write data are processed.

BRIEF SUMMARY OF THE INVENTION

In view of this, the present invention proposes a memory device which can regulate the clock period of the read/write data in order to solve the problems mentioned above.

A memory device comprises a memory control unit and a write output clock device. The memory control unit is configured to provide a write input clock and a first control value. The write output clock device is configured to generate a plurality of internal clocks according to the write input clock, and select a target internal clock from among the plurality of internal clocks according to control of the memory control unit. The write output clock device delays the target internal clock based on the first control value to become a write output clock delivered to a memory unit. The memory unit generates a data signal (DQ signal) according to the write output clock, and the memory control unit receives the DQ signal and identifies whether the write output clock meets the time-sequence requirements of memory unit. If the memory control unit identifies that the write output clock fails to meet the time-sequence requirements, the memory control unit adjusts the first control value and/or the selected target internal clock for regulating the write output clock.

DETAILED DESCRIPTION OF THE INVENTION

Figure 1:
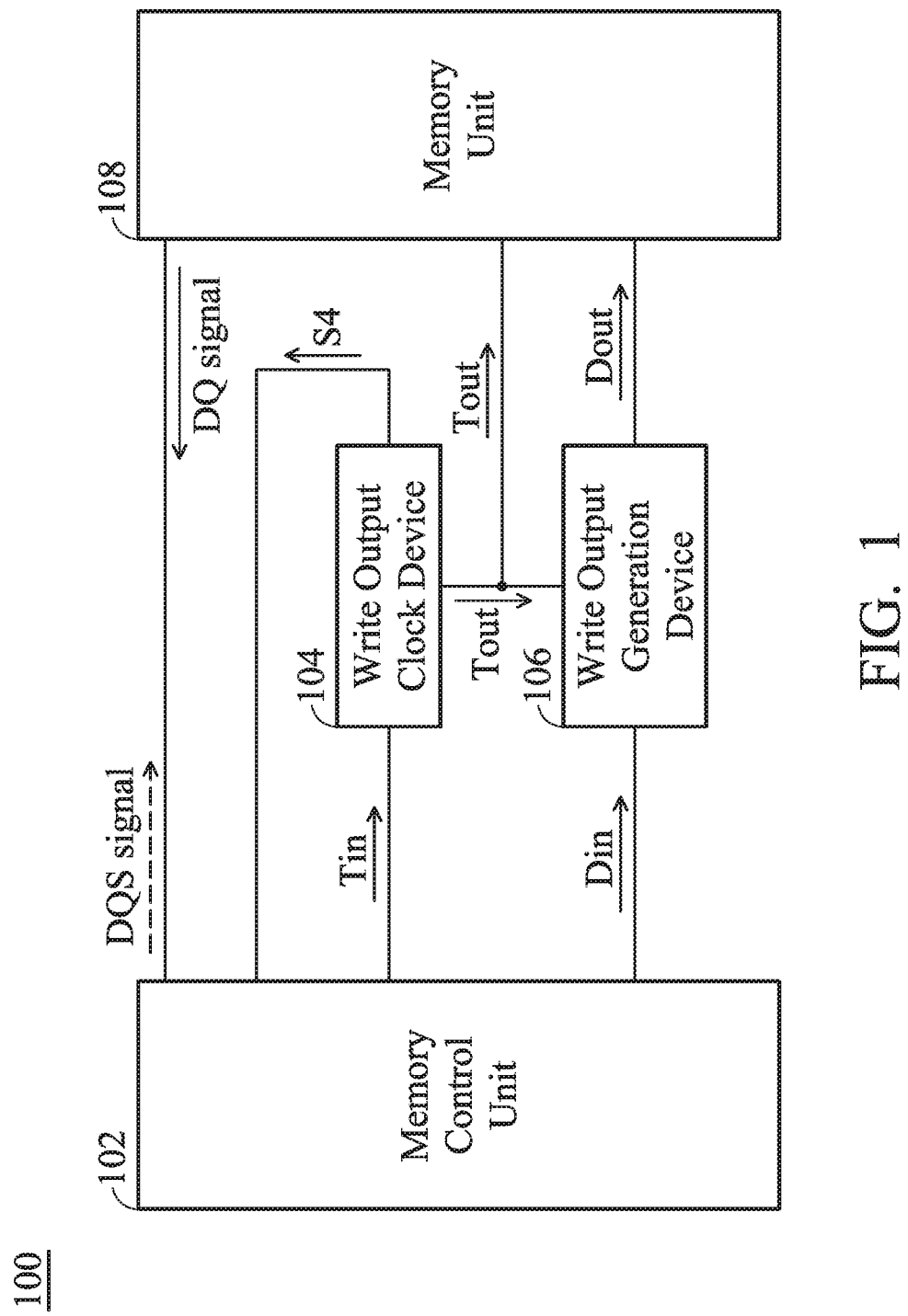
FIG. 1 is a block diagram of an operation for writing data in a memory device, in accordance with one embodiment of the present invention.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following description is an embodiment of the present invention. The purpose of the present invention is to exemplify the general principles of the invention and should not be construed as limiting the scope of the invention, which is defined by the scope of the claims.

There is at least one control device set in the memory device. During the period of writing data into DRAM, the control device in the memory device needs to control the data selection signal (DQS signal) between each DRAM particle to be sent at independent time, in order to comply with the time for the DQS signal reaching each DRAM particle and satisfy the time-sequence requirements, such as tDQSS, between the DQS signal and the input clock for DRAM particles. While the DRAM reads data, each DRAM particle has to adjust the time it takes to deliver the read DQS signal to the control device in the memory device, and the input clock and read DQS signal satisfy the time-sequence requirements, such as tDQSCK, for the DRAM particles. Because the clocks of the DQS signals output from different DRAM particles are not identical, the control device in the memory device needs to adjust the input selection clocks of the DQS signals output from different DRAM particles, in order to correctly deliver the data to the control device in the memory device.

For the operation regarding the writing/reading data of DRAM, JEDEC (Joint Electron Tube Engineering Council)

provides the standards for the writing/reading regulation function of DRAM. Under JEDEC, the memory device in the present invention has the function of adjusting the write output clock of each of the DRAM particles on the data path, and the memory device is used to compensate for the write offset of the DIMM having a fly-by structure. In addition, Under JEDEC, the memory device in the present invention can adjust the clock differences of the DQS signals output from different DRAM particles in order to correctly deliver the data to the control device in the memory device.

The control device in the memory device can be a controller, a processor, microprocessor or central processing unit (CPU) etc., but the present invention is not so limited.

FIG. 1 is a block diagram of an operation for writing data in a memory device 100, in accordance with one embodiment of the present invention. As shown in FIG. 1, the memory device 100 includes a memory control unit 102, a write output clock device 104, a write output generation device 106 and a memory unit 108 etc. In some embodiments, the memory unit 108 can be a DRAM, SDRAM (synchronous dynamic random-access memory) and so on, and the memory unit 108 has different DDR storage particles. These DDR storage particles can be connected to the memory control unit 102, the write output clock device 104 and the write output generation device 106 via the input/output contact.

In some embodiments, the memory control unit 102 provides a write input clock Tin to the write output clock device 104. The write output clock device 104 can delay the write input clock Tin to generate a write output clock Tout based on the control of the memory control unit 102. At the same time, the write output clock device 104 initially delivers the write output clock Tout to the memory unit 108. The DDR storage particles in the memory unit 108 generate a data signal, such as DQ signal, to the memory control unit 102 based on the write output clock Tout. According to the DQ signal of the memory unit 108, the memory control unit 102 can identify whether the write output clock Tout complies with the time-sequence requirements. If the memory control unit 102 identifies that the write output clock Tout fails to comply with the time-sequence requirements for operating the memory unit 108, the memory control unit 102 would control the output clock device 104 to continuously regulate the write input clock Tin for changing the write output clock Tout to memory unit 108.

When the memory control unit 102 identifies that the write output clock Tout complies with the time-sequence requirements for operating the memory unit 108, the write output clock device 104 delivers the write output clock Tout to the write output generation device 106. At the same time, the memory control unit 102 can also provide the write input data Din to the write output generation device 106. According to the write output clock Tout from the write output clock device 104, the write output generation device 106 adjusts the clock period of the write input data Din for generating the write output data Dout to the memory unit 108. In addition, the write output clock device 104 also includes a sampling unit (not pictured). The sampling unit can sample the write output clock Tout, and the sampling unit delivers the sampling result S4 to the memory control unit 102. According to the sampling result S4, the memory control unit 102 can identify if the write output clock Tout meets the time-sequence requirements of the memory unit 108.

In some embodiments, the memory unit 108 can receive the write output clock Tout output by the write output clock device 104 for generating the DQ signal (or data signal) to the memory control unit 102. In some other embodiments, the memory unit 108 can directly receive the DQS signal (or data selection control signal) from the memory control unit 102 to generate the DQ signal (or data signal) to the memory control unit 102. According to the DQ signal, the memory control unit 102 identifies whether the write output clock Tout meets the time-sequence requirements of the memory unit 108, but the present invention is not so limited. The procedures of the operation of the write output clock device 104 are illustrated in detail below.

Figure 2:
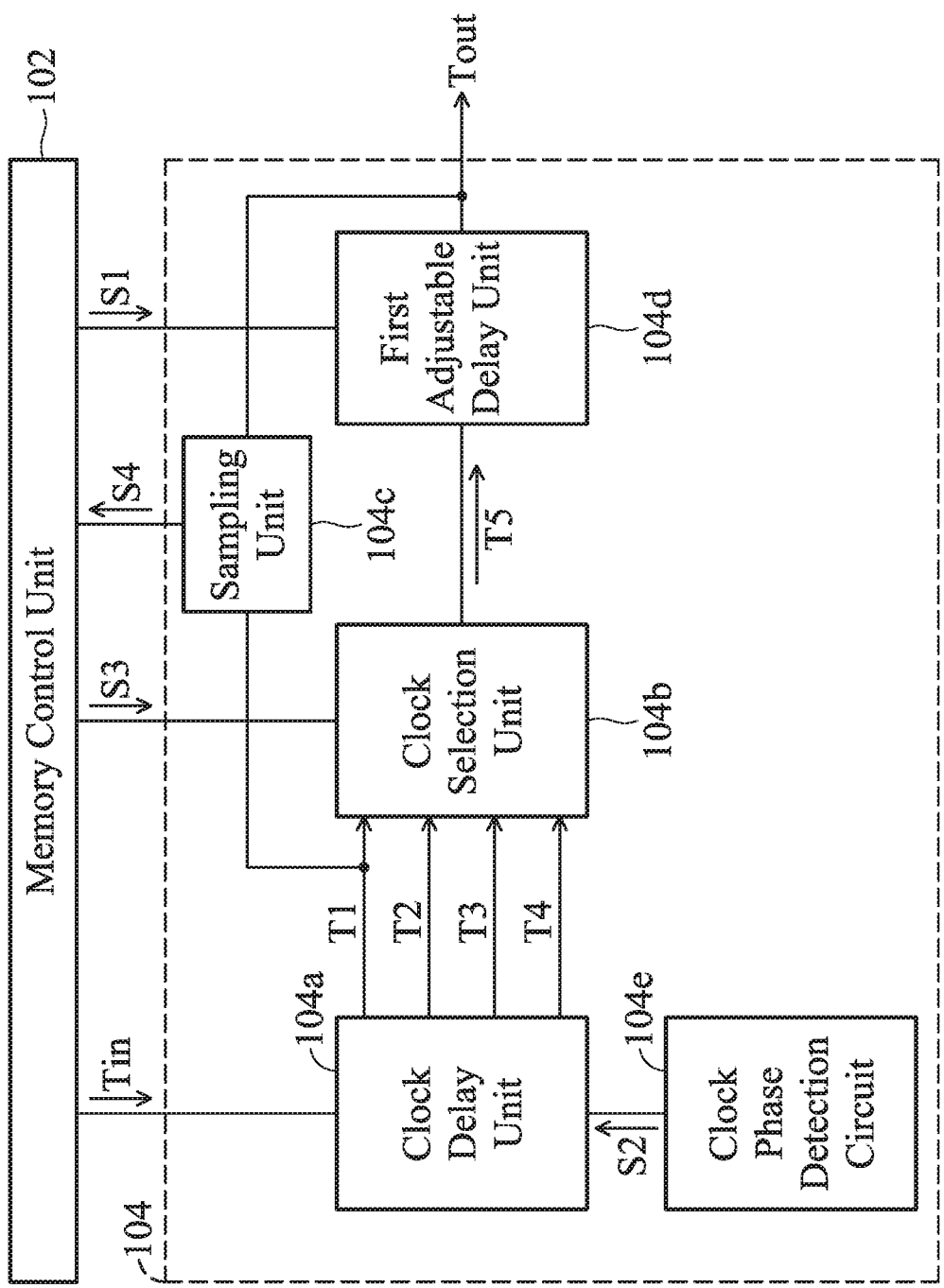
FIG. 2 is a block diagram of the write output clock device, in accordance with one embodiment of the present invention.

FIG. 2 is a block diagram of the write output clock device 104, in accordance with one embodiment of the present invention. As shown in FIG. 2, the write output clock device 104 includes a clock delay unit 104a, a clock selection unit 104b, a sampling unit 104c, a first adjustable delay unit 104d and a clock phase detection circuit 104e. The clock delay unit 104a is coupled to the memory control unit 102 to receive the write input clock Tin. In addition, the clock delay unit 104a is also coupled to the clock phase detection circuit 104e to receive the second control value S2. Based on the write input clock Tin and the second control value S2, the clock delay unit 104a generates a plurality of internal clocks to the clock selection unit 104b. The plurality of internal clocks include a first internal clock T1, a second internal clock T2, a third internal clock T3 and a fourth internal clock T4, and the first to fourth internal clocks T1-T4 represent different delay clock periods.

In some embodiments, the first internal clock T1 and the write input clock Tin have the same clock period. The second internal clock T2 is delayed by a quarter of the clock period of the first internal clock T1. The third internal clock T3 is delayed by half the clock period of the first internal clock T1. The fourth internal clock T4 is delayed by three-quarters of the clock period of the first internal clock T1. However, the present invention is not so limited.

As mentioned above, the clock selection unit 104b is coupled to the memory control unit 102, the clock delay unit 104a and the first adjustable delay unit 104d. After the clock selection unit 104b receives the plurality of internal clocks including the first to fourth internal clocks T1-T4, based on the selection signal S3 output by the memory control unit 102, the clock selection unit 104b selects one of the plurality of internal clocks as a target internal clock T5. The clock selection unit 104b outputs the target internal clock T5 to the first adjustable delay unit 104d.

The first adjustable delay unit 104d is coupled to the memory control unit for receiving the first control value S1 output by the memory control unit 102. According to the first control value S1, the first adjustable delay unit 104d delays the clock period (or time period) of the target internal clock T5 to generate the write output clock Tout. In view of FIG. 1 and FIG. 2, the first adjustable delay unit 104d can deliver the write output clock Tout to the memory unit 108, and the memory unit 108 generates the DQ signal (data signal) to the memory control unit 102 according to the write output clock Tout. If the memory control unit 102 identifies that the write output clock Tout fails to comply with the time-sequence requirements for operating the memory unit 108 based on the DQ signal, the memory control unit 102 outputs the selection signal S3 to control the clock selection unit 104b, and the clock selection unit 104b selects one of the other internal clocks which are not selected as the target internal clock T5. For example, if the clock selection unit 104b selects the first internal clock T1 at the first time, the clock selection unit 104b selects one of the second to fourth internal clocks as the target internal clock T5 at the second time.

At the same time, the memory control unit 102 can also adjust the first control value S1 to the first adjustable delay unit 104d. As a result, according to the adjusted first control value S1, the first adjustable delay unit 104d adjusts the delay clock period (or time) of the adjusted target internal clock T5 for outputting the write output clock Tout to the memory unit 108. When the memory control unit 102 identifies that the write output clock Tout meets the time-sequence requirements of the memory unit 108, the memory control unit 102 stops adjusting the first control value S. The clock selection unit 104b stops selecting the other internal clocks, and the first adjustable delay unit 104d stop changing the delay clock period (or time) of the target internal clock T5.

In some other embodiments, when the memory control unit 102 identifies that the write output clock Tout fails to meet the time-sequence requirements of the memory unit 108 based on the DQ signal, the sampling unit 104c in the write output clock device 104 receives the first internal clock T1 and samples the clock period of the write output clock Tout. The sampling unit 104c compares the first internal clock T1 to the clock period of the write output clock Tout for outputting the sampling result S4 to the memory control unit 102. According to the sampling result S4, the memory control unit 102 can control the clock selection unit 104b to select one of a plurality of internal clocks as a target internal clock T5.

When the memory control unit 102 identifies that the write output clock Tout meets the time-sequence requirements of the operation of the memory unit 108, the first adjustable delay unit 104d delivers the write output clock Tout to the write output generation device 106.

In some other embodiments, the clock selection unit 104b can select the first to fourth internal clocks T1-T4 in order as the target internal clock T5. The steps of the operation of this embodiment are illustrated in detail below.

Figure 3:
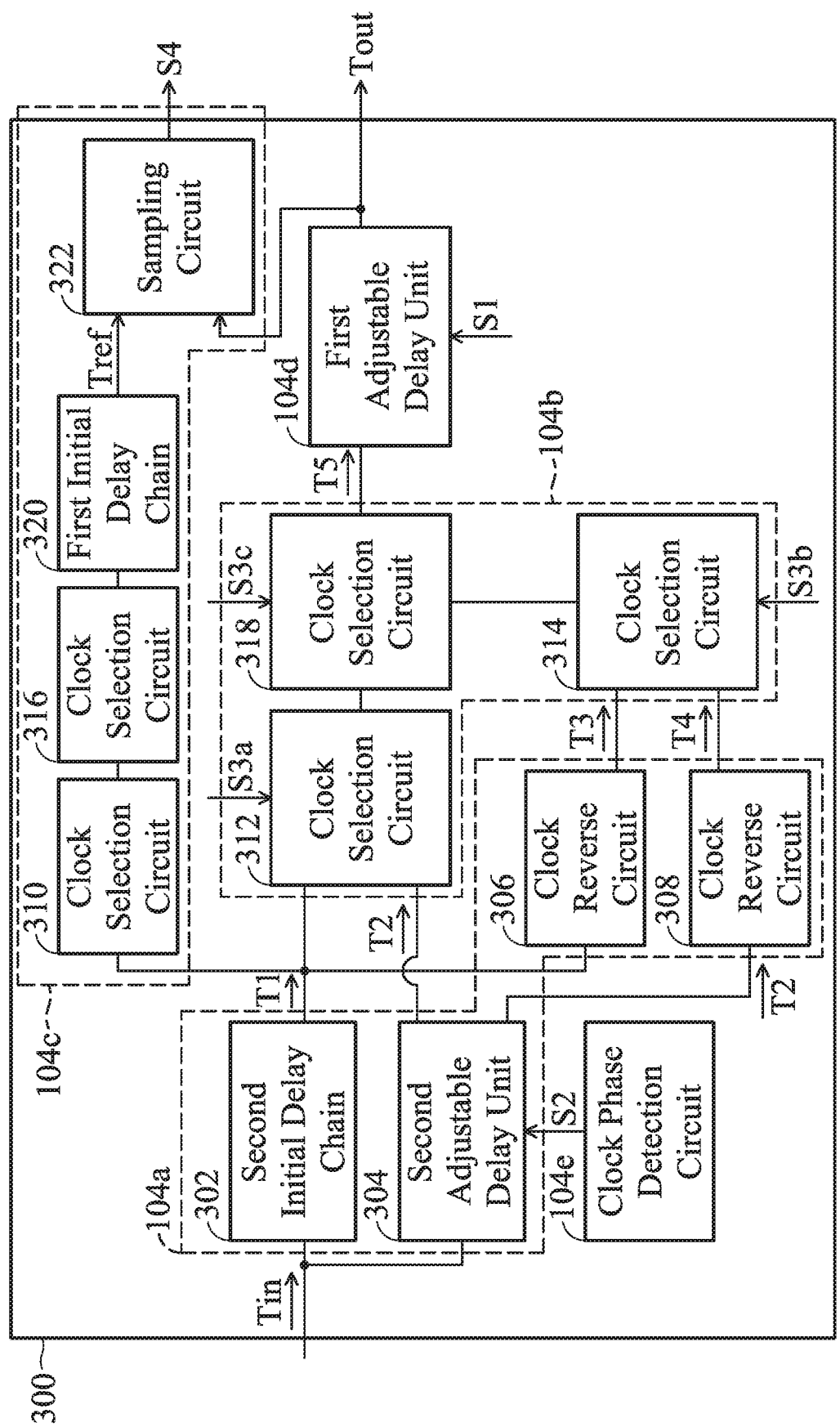
FIG. 3 is a block diagram of the write output clock device, in accordance with another embodiment of the present invention.

FIG. 3 is a block diagram of the write output clock device 300, in accordance with another embodiment of the present invention. Please refer to FIGS. 1-3 for illustrating each of the following embodiments. In FIG. 2 and FIG. 3, the clock delay unit 104a in the write output clock device 104 is composed of the second initial delay chain 302, the second adjustable delay unit 304, the clock reverse circuit 306 and the clock reverse circuit 308. The clock selection unit 104b in the write output clock device 104 is composed of the clock selection circuits 312, 314 and 318 in the write output clock device 300. The sampling unit 104c in the write output clock device 104 is composed of the clock selection circuit 310, the clock selection circuit 316, the first initial delay chain 320 and sampling circuit 322 in the write output clock device 300. For simplifying the illustration of each of the embodiments in the present invention, the write output clock device 104 in FIG. 1 is replaced by the write output clock device 300.

As shown in FIG. 1 and FIG. 3, when the write output clock device 300 receives the write input clock Tin from the memory control unit 102, the second initial delay chain 302 generates the first internal clock T1. In addition, according to the second control value S2 output by the clock phase detection circuit 104e, the second adjustable delay unit 304 converts the write input clock Tin to the second internal clock T2. The first internal clock T1 is converted as the third internal clock T3 by the clock reverse circuit 306, and the second internal clock T2 is converted as the fourth internal clock T4 by the clock reverse circuit 308.

Specifically, in some embodiments, the first to fourth internal clocks T1-T4 represent different delay clock periods (or time). The delay clock periods represented by the first to fourth internal clocks T1-T4 have been described in detail above, and thus are not described again. In some other embodiments, the second internal clock T2 is delayed by a quarter of the clock period of the first internal clock T1. The third internal clock T3 is delayed by a quarter of the clock period of the second internal clock T2. The fourth internal clock T4 is delayed by a quarter of the clock period of the third internal clock T3. However, the present invention is not so limited.

In some embodiments, as shown in FIG. 1, when the memory control unit 102 outputs the DQS signal to the memory unit 108, the DRAM particles in the memory unit 108 will generate a DQ signal (or data signal) to the memory control unit 102 according to its own write regulation function. The memory control unit 102 receives the DQ signal (or data signal). According to the DQ signal, the memory control unit 102 identifies whether the write output clock Tout meets the time-sequence requirements of the operation of the memory unit 108. Specifically, in some other embodiments, by receiving the write output clock Tout, the memory unit 108 can also generate the DQ signal to the memory control unit 102, but the present invention is not so limited.

Because the different firmware units are configured in the memory control unit 102, the methods for determining the time-sequence requirements by the memory control unit 102 according to the DQ signal (or data signal) are not completely identical. When the memory control unit 102 receives the potential of the DQ signal which is "0", it represents that the write output clock Tout (or the DQS signal) transmitted to DRAM particles is ahead of time-sequence requirements. Therefore, the memory control unit 102 delays the write output clock Tout. When the memory control unit 102 receives the potential of the DQ signal which is "1", it represents that the write output clock Tout (or DQS signal) transmitted to DRAM particles meets the time-sequence requirements. However, the present invention is not so limited.

In FIG. 1 and FIG. 3, when the memory control unit 102 identifies that the write output clock Tout fails to meet the time-sequence requirements, the memory control unit 102 begins to the steps of delaying the write output clock Tout (or the steps of hardware regulation). At the initial step, according to the selection signal S3a output by the memory control unit 102, the clock selection circuit 312 in the write output clock device 300 can select and adjust the first internal clock T1 to the clock selection circuit 318. Then, the clock selection circuit 318 receives the adjusted first internal clock T1 and the selection signal S3c which is from the memory control unit 102 to generate the target internal clock T5. At the same time, the initial setting of the first control value provided by the memory control unit 102 is zero, but the present invention is not so limited. The first adjustable delay unit 104d receives the first control value S1 (equal to zero) and the target internal clock T5 to generate the write output clock Tout. At this time, the total delay period of the write output clock Tout is the sum of the delays of the second initial delay chain 302, the clock selection circuit 312 and 318, and the first adjustable delay unit 104d.

In the initial step, if the DQ signal generated by the memory unit 108 according to the write output clock Tout is still determined by the memory control unit 102 to not meet the time-sequence requirements, the memory control unit 102 would increase the first control value S1 to the first adjustable delay unit 104d to increase the delay clock period of the write output clock Tout. When the memory control unit 102 increases the first control value S1 that is equal to the second control value S2, the memory control unit 102 stops the initial step. Specifically, in the initial step, before the first control value S1 is equal to the second control value S2, the initial step of delaying the write output clock Tout is stopped as long as the memory control unit 102 determines that the write output clock Tout meets the time-sequence requirements. When the first control value S1 is equal to the second control value S2, if the memory control unit 102 determines that the write output clock Tout fails to meet the time-sequence requirements, the memory control unit 102 stops the initial step of the hardware regulation and performs the second step of the hardware regulation.

In the second step of the hardware regulation, the clock selection circuit 312 in the write output clock device 300 selects and adjusts the second internal clock T2 to the clock selection circuit 318 according to the selection signal S3a output by the memory control unit 102. Then, the clock selection circuit 318 receives the selection signal S3c from the memory control unit 102 and the adjusted second internal clock T2 to generate the target internal clock T5. At the same time, the first control value S provided by the memory control unit 102 is reset to zero, but the invention is not limited thereto. The first adjustable delay unit 104d receives the first control value S1 (equal to zero) and the target internal clock T5 to generate a write output clock Tout. At this time, the total delay period of the write output clock Tout is the sum of the delays of the second initial delay chain 302, the clock selection circuits 312 and 318, and the first adjustable delay unit 104d. That is, the total delay of the write output clock Tout in the second step is as the same as the total delay of the write output clock Tout in the initial step.

In the second step, if the DQ signal generated by the memory unit 108 according to the write output clock Tout is still determined by the memory control unit 102 to not meet the time-sequence requirements, the memory control unit 102 adds the first control value S1 to the first adjustable delay unit 104d for increasing the delay clock period of the write output clock Tout. In the second step, unlike the initial step, the write output clock device 300 samples the write output clock Tout through the sampling circuit 322, and the sampling circuit 322 compares the sampled write output clock Tout with a reference clock Tref to output the sampling result S4 to the memory control unit 102. The sampling unit 104c in FIG. 2 can be composed of the clock selection circuits 310 and 316, the first initial delay chain 320 and the sampling circuit 322 in FIG. 3. It should be noted that the clock selection circuits 310 and 316 and the first initial delay chain 320 delay the first internal clock T1 to generate the reference clock Tref.

In the second step, the memory control unit 102 determines whether the write output clock Tout meets the time-sequence requirements according to the sampling result S4. Since different firmware is configured in the memory control unit 102, the ways in which the memory control unit 102 determines the time-sequence requirements according to the sampling result S4 are not completely identical. For example, when the potential of the sampling result S4 received by the memory control unit 102 is "1", it represents that the write output clock Tout transferred to the DRAM particles still fails to meet the time-sequence requirements. Therefore, when the potential of the sampling result S4 received by the memory control unit 102 is "0", the memory control unit 102 stops the second step of performing the hardware regulation. However, the invention is not limited thereto.

When the potential of the sampling result S4 received by the memory control unit 102 is "0", the sum of the delays of the write output clock Tout is the sum of the delays of the first initial delay chain 320, the second initial delay chain 302, the clock selection circuits 310 and 316, and the delay of the ½ clock period. At the same time, the sum of the delays of the write output clock Tout is also as the same as the sum of the delays of the following components: the second adjustable delay unit 304, the clock selection circuits 312 and 318, and the first adjustable delay unit 104d.

When the potential of the sampling result S4 received by the memory control unit 102 is "0", if the memory control unit 102 determines that the write output clock Tout fails to meet the time-sequence requirements according to the DQ signal, the memory control unit 102 continues to perform the third step of the hardware regulation.

In the third step, the memory control unit 102 outputs the selection signals S3b, S3c to control the write output clock device 300. At this time, the write output clock device 300 selects the third internal clock T3 output from the clock reverse circuit 306, and the write output clock device 300 generates the target internal clock T5 through the clock selection circuits 314 and 318 to output the write output clock Tout. In the initial third step, the memory control unit 102 resets the first control value S1 to zero. If the memory control unit 102 still determines that the DQ signal generated by the memory unit 108 according to the write output clock Tout fails to meet the time-sequence requirements, the memory control unit 102 increases the first control value S1 to the first adjustable delay unit 104d for increasing the delay clock period of the write output clock Tout. When the first control value S1 increased by the memory control unit 102 is equal to the second control value S2, the memory control unit 102 stops the third step. The delay process in the third step is similar to the initial step of the hardware regulation. The significant difference is that the initial step generates the target internal clock T5 according to the first internal clock T1, and the third step generates the target internal clock T5 according to the third internal clock T3, so it will not be described again.

In the third step, when the first control value is identical to the second control value, if the memory control unit 102 determines that the write output clock Tout fails to meet the time-sequence requirements according to the DQ signal, the memory control unit 102 stops the third step of the hardware regulation and performs the fourth step of the hardware regulation.

In the fourth step, the memory control unit 102 outputs the selection signals S3b and S3c to control the write output clock device 300. At this time, the write output clock device 300 selects the fourth internal clock T4 output by the clock reverse circuit 308 and generates the target internal clock T5 through the clock selecting circuits 314 and 318 to output the write output clock Tout. The delay process in the fourth step is similar to the initial step of the hardware regulation. The difference is that the initial step generates the target internal clock T5 according to the first internal clock T1, and the fourth step generates the target internal clock T5 according to the fourth internal clock T4, so it will not be described again.

Through the initial step to the fourth step of the hardware regulation mentioned above, it is ensured that the write output clock Tout output by the write output clock device 300 meets the time-sequence requirements of the memory unit 108. In particular, the initial step to the fourth step of the hardware regulation can also ensure that the delay of the write output clock Tout is continuous and linearly increased.

In addition, by the four steps of the hardware regulation above, the adjustment of the first control value S1 and the switching of the first to fourth internal clocks T1-T4 can ensure that the delay of the write output clock Tout with respect to the write input clock Tin is continuous and linearly increased.

After the write output clock Tout is completed according to the hardware regulation of the memory device, the memory control unit 102 generates the write output data Dout to the memory unit 108 via the write output generation device 106. The operation process for generating the write output data Dout will be described in detail below.

Figure 4:
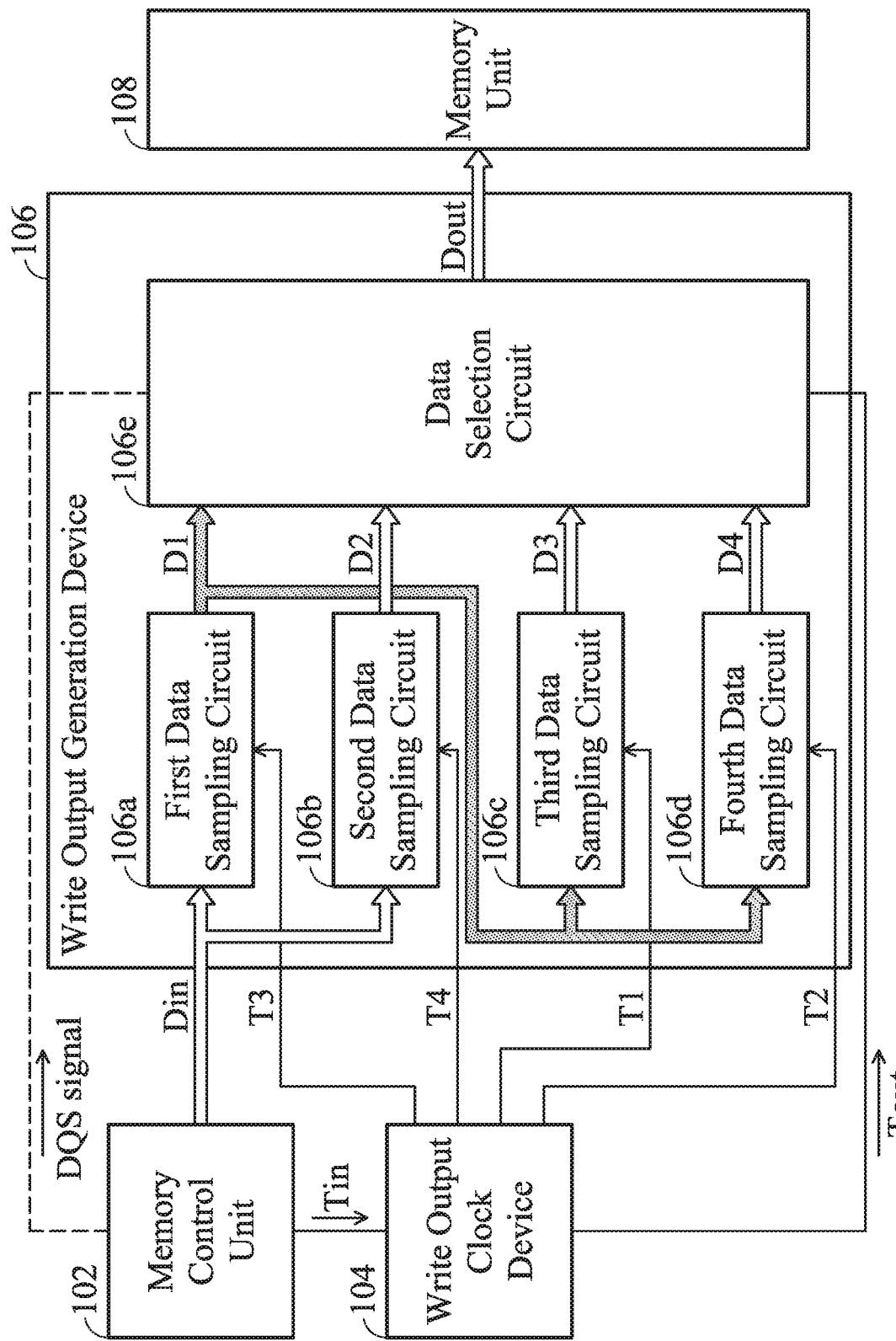
FIG. 4 depicts a flow chart of the operation of the write output generation device, in accordance with one embodiment of the present invention.

FIG. 4 depicts a flow chart of the operation of the write output generation device 106, in accordance with one embodiment of the present invention. As shown in FIG. 4, the write output generation device 106 includes first to fourth data sampling circuits 106a-106d and a data selection circuit 106e. The write output generation device 106 is coupled to the memory control unit 102 to receive the write input data Din, and the write output generation device 106 is further coupled to the write output clock device 104 to receive the first to fourth internal clocks T1-T4 and the write output clock Tout. When the memory control unit 102 completes the hardware regulation's steps mentioned above to output an appropriate write output clock Tout, the write output clock device 104 delivers the first to fourth internal clocks T1-T4 to the write output generation device 106. Simultaneously, the memory control unit 102 also outputs the write input data Din to the write output generation device 106.

The first data sampling circuit 106a in the write output generation device 106 receives the write input data Din and the third internal clock T3. The first data sampling circuit 106a adjusts the clock period of the write input data Din according to the third internal clock T3, and the first data sampling circuit 106a outputs the first internal data D1 to the data selection circuit 106e.

The second data sampling circuit 106b in the write output generation device 106 receives the write input data Din and the fourth internal clock T4. The second data sampling circuit 106b adjusts the clock period of the write input data Din in accordance with the fourth internal clock T4. The second data sampling circuit 106b outputs the second internal data D2 to the data selection circuit 106e.

The third data sampling circuit 106c in the write output generation device 106 receives the first internal data D1 and the first internal clock T1 output from the first data sampling circuit 106a. The third data sampling circuit 106c adjusts the clock period of the first internal data D1 in accordance with the first internal clock T1. The third data sampling circuit 106c outputs the third internal data D3 to the data selection circuit 106e.

The fourth data sampling circuit 106d in the write output generation device 106 receives the first internal data D1 and the second internal clock T2 output from the first data sampling circuit 106a. The fourth data sampling circuit 106d adjusts the clock period of the first internal data D1 in accordance with the second internal clock T2, and the fourth data sampling circuit 106d outputs the fourth internal data D4 to the data selection circuit 106e.

As described above, all of the first to fourth internal clocks T1-T4 are generated by the write output clock device 104 according to the write input clock Tin. The write output generation device 106 samples the first internal data D1 based on the first internal clock T1 for generating the third internal data D3. The write output generation device 106 samples the first internal data D1 based on the second internal clock T2 for generating the fourth internal data D4. The write output generation device 106 samples the write input data Din based on the third internal clock T3 for generating the first internal data D1. The write output generation device 106 samples the write input data Din based on the fourth internal clock T4 for generating the second internal data D2. As a result, the first to fourth internal data D1-D4 respectively correspond to the third internal clock T3, the fourth internal clock T4, the first internal clock T1 and the second internal clock T2 in order.

In some embodiments, the data selection circuit 106e in the write output generation device 106 selects the first to fourth internal data D1-D4 in accordance with the write output clock Tout output by the write output clock device 104 to output the write output data Dout. For example, if the write output clock Tout is the first internal clock T1, the data selection circuit 106e selects the third internal data D3 corresponding to the first internal clock T1 as the write output data Dout, according to the write output clock Tout. If the write output clock Tout is the third internal clock T3, the data selection circuit 106e selects the first internal data D1 corresponding to the third internal clock T3 as the write output data Dout, in accordance with the write output clock Tout, and so on. In this way, it can be ensured that the write output data Dout output by the data selection circuit 106e meets the time-sequence requirements. Specifically, the embodiments described above are merely illustrative, but the invention is not limited thereto.

In some other embodiments, the data selection circuit 106e may also select the first to fourth internal data D1-D4 as the write output data Dout according to the DQS signal (or data selection control) output by the memory control unit 102. Because the memory control unit 102 can identify the internal clock (one of the first to fourth internal clocks T1-T4) selected by the write output clock device 104 as the write output clock Tout, the memory control unit 102 can generate a control signal (e.g., a DQS signal) to the data selection circuit 106e based on the selected internal clock. Therefore, by outputting the DQS signal, the memory control unit 102 controls the data selection circuit 106e to select the first to fourth internal data D1 to D4 as the write output data Dout.

In addition to the clock cycle adjustment of the operation of writing data from the memory control unit 102 to the memory unit 108, the present invention can also perform operations for reading data from the memory unit 108 to the memory control unit 102. Clock cycle adjustment.

Figure 5:
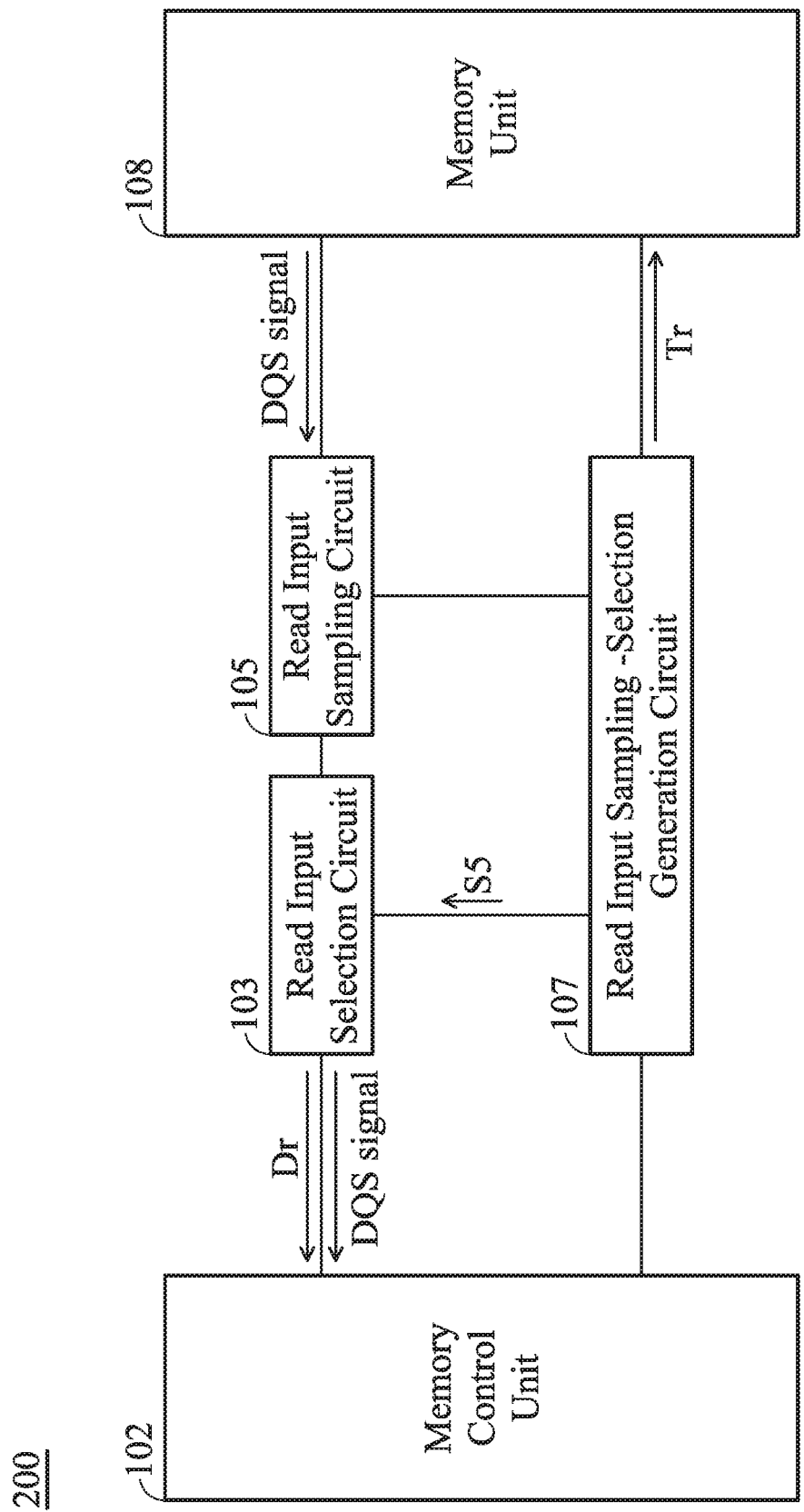
FIG. 5 is a block diagram of the operation for reading data in a memory device, in accordance with one embodiment of the present invention.

FIG. 5 is a block diagram of an operation for reading data in a memory device 200, in accordance with one embodiment of the present invention. As shown in FIG. 5, the memory device 200 includes a memory control unit 102, a read input selection circuit 103, a read input sampling circuit 105, a read input sampling-selection generation circuit 107 and a memory unit 108. The memory control unit 102 controls the read input sampling-selection generation circuit 107 to generate a read sampling clock Tr to the memory unit 108. The read input sampling-selection generation circuit 107 has the same circuit architecture as the write output clock device 104 in FIG. 1. In addition, the memory control unit 102 can also control the read input selection circuit 103 and the read input sampling circuit 105 by read input sampling-selection generation circuit 107.

In some embodiments, when the memory unit 108 receives the read sampling clock Tr, the memory unit 108 outputs the DQS signal. The memory control unit 102 samples the DQS signal by the read input selection circuit 103 and the read input sampling circuit 105, and the memory control unit 102 determines whether the sampling result meets the time-sequence requirements of the read input data of the memory control unit 102.

Since different firmware is configured in the memory control unit 102, the ways in which the memory control unit 102 determines the time-sequence requirements according to the DQS signals are not completely identical. For example, when the potential of the DQS signal sampled by the memory control unit 102 is "0", it represents that the DQS signal fails to meet the time-sequence requirements of the read input data of the memory control unit 102, and the memory control unit 102 adjusts the read sampling clock Tr. When the potential of the DQS signal sampled by the memory control unit 102 is "1", it indicates that the DQS signal meets the time-sequence requirements of the read input data of the memory control unit 102. However, the invention is not so limited.

The operation mentioned above ensures that the clock period of the read selection signal S5 output by the read input sampling-selection generation circuit 107 is ¼ clock period earlier than the read sampling clock Tr. As a result, the read input selection circuit 103 advances by ¼ of the clock period of the DQS signal received by the memory control unit 102. This ensures that the input signal (including the DQS signal and the read input data Dr) can be completely delivered to the memory control unit 102.

In conclusion, the operation methods of the hardware regulation for a clock, which are proposed by the present invention, can process the clock regulation to the write output clock Tout and read sampling clock Tr. This can ensure that a clock that is adjusted by the hardware regulation can satisfy the monotonic continuity requirements of memory units (include DRAM), which have different operation frequencies. Thus, the write regulation mechanism and the read regulation mechanism of the present invention can make sure that the memory unit satisfies time-sequence requirements such as tDQSS, between the input clock and DQS signal for DRAM particles. Each of the DRAM particles can also output data in accordance with the time-sequence requirements (e.g., tDQSCK) while the memory control unit is reading the data.

While the invention has been described above in terms of a preferred embodiment, it is not intended to limit the scope of the invention, and it should be understood by those of ordinary skill in the art without departing from the spirit and scope of the invention. Instead, the scope of the invention should be determined by the scope of the appended claims.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

What is claimed is:

1. A memory device, comprising:
   a memory control unit, configured to provide a write input clock and a first control value; and
   a write output clock device, configured to generate a plurality of internal clocks according to the write input clock, and select a target internal clock from the plurality of internal clocks according to control of the memory control unit, and delay the target internal clock based on the first control value to become a write output clock delivered to a memory unit;
   wherein the plurality of internal clocks comprises different delay clock periods, and the memory unit generates a data signal according to the write output clock, the memory control unit receives the data signal to identify whether the write output clock meets time-sequence requirements of the memory unit according to the data signal,
   when the write output clock fails to meet the time-sequence requirements, the memory control unit changes the first control value and/or the selected target internal clock for regulating the write output clock,
   wherein if the memory control unit identifies that the write output clock meets the time-sequence requirements, the memory control unit outputs write input data.

2. The memory device of claim 1, wherein the write output clock device comprises a clock delay unit coupled to the write input clock and a second control value to generate the plurality of internal clocks.

3. The memory device of claim 2, wherein the write output clock device further comprises a clock selection unit coupled to the plurality of internal clocks and the memory control unit; wherein the memory control unit controls the clock selection unit to select one of the plurality of internal clocks as the target internal clock.

4. The memory device of claim 3, wherein when the memory control unit regulates the first control value to be equal to the second control value, when the memory control unit identifies that the write output clock fails to comply with the time-sequence requirements, the memory control unit controls the clock selection unit to change the selected target internal clock.

5. The memory device of claim 1, wherein the plurality internal clocks comprise a plurality of first to fourth internal clocks; wherein the first internal clock and the write input clock have an identical clock period, and the second internal clock is delayed by a quarter of the clock period of the first internal clock, and the third internal clock is delayed by half the clock period of the first internal clock, and the fourth internal clock is delayed by three quarters of the clock period of the first internal clock.

6. The memory device of claim 5, wherein a clock selection unit sequentially selects one of the plurality of first to fourth internal clocks as the target internal clock.

7. The memory device of claim 1, further comprising a write output generation device coupled to the write input data and configured to generate write output data to the memory unit according to the write output clock and the plurality of internal clocks.

8. The memory device of claim 7, wherein the write output generation device comprises:
   a first data sampling circuit, coupled to the write input data and the third internal clock to generate first internal data;
   a second data sampling circuit, coupled to the write input data and the fourth internal clock to generate second internal data;
   a third data sampling circuit, coupled to the first internal data and the first internal clock to generate third internal data;
   a fourth data sampling circuit, coupled to the first internal data and the second internal clock to generate fourth internal data; and a data selection circuit, configured to select one of the first to fourth internal data to generate the write output data according to the write output clock.

9. The memory device of claim 1, further comprising the memory unit.

* * * * *